United States Patent
Matsukawa et al.

(10) Patent No.: US 7,582,950 B2
(45) Date of Patent: Sep. 1, 2009

(54) SEMICONDUCTOR CHIP HAVING GETTERING LAYER, AND METHOD FOR MANUFACTURING THE SAME

(75) Inventors: Kazuhito Matsukawa, Tokyo (JP); Tsuyoshi Koga, Tokyo (JP); Akio Nishida, Tokyo (JP); Yoshiko Higashide, Tokyo (JP); Jun Shibata, Tokyo (JP); Hiroshi Tobimatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 316 days.

(21) Appl. No.: 11/190,011

(22) Filed: Jul. 27, 2005

(65) Prior Publication Data

US 2006/0022321 A1    Feb. 2, 2006

(30) Foreign Application Priority Data

Jul. 28, 2004  (JP)  ............... 2004-220319

(51) Int. Cl.
*H01L 29/06* (2006.01)

(52) U.S. Cl. ............... 257/622; 257/618; 257/620; 257/E29.022

(58) Field of Classification Search ............... 257/678, 257/618, 620, 622, E29.022
See application file for complete search history.

(56) References Cited

U.S. PATENT DOCUMENTS

| | | | | |
|---|---|---|---|---|
| 4,608,096 A | * | 8/1986 | Hill | 148/33 |
| 5,138,421 A | * | 8/1992 | Saito | 257/526 |
| 5,194,395 A | * | 3/1993 | Wada | 438/143 |
| 5,644,156 A | * | 7/1997 | Suzuki et al. | 257/485 |
| 5,874,325 A | * | 2/1999 | Koike | 438/143 |
| 6,100,150 A | * | 8/2000 | Shih et al. | 438/308 |
| 6,605,518 B1 | * | 8/2003 | Ohmi et al. | 438/458 |
| 7,327,019 B2 | * | 2/2008 | Kanamori et al. | 257/682 |
| 2002/0100941 A1 | * | 8/2002 | Yonehara et al. | 257/359 |
| 2004/0061207 A1 | * | 4/2004 | Ding | 257/678 |
| 2005/0037596 A1 | * | 2/2005 | Erokhin et al. | 438/471 |

FOREIGN PATENT DOCUMENTS

| | | |
|---|---|---|
| JP | 56-56660 | 5/1981 |
| JP | 59-141251 | 8/1984 |
| JP | 63-211635 | 9/1988 |
| JP | 2001-250957 | 9/2001 |

* cited by examiner

*Primary Examiner*—Alexander G Ghyka
*Assistant Examiner*—Angel Roman
(74) *Attorney, Agent, or Firm*—Oblon, Spivak, McClelland, Maier & Neustadt, P.C.

(57) ABSTRACT

In a semiconductor chip A wherein an element layer 2 having transistors and the like is formed on the front face, and the back face is joined to an underlying member, such as a package substrate, the thickness T is made 100 μm or less, and thereafter, a gettering layer 3 is formed on the back face of the semiconductor chip A. The gettering layer 3 is formed, for example, by polishing the back face of said semiconductor chip A using a polishing machine. Thereby, the yield of devices can be improved in the step for assembling the package.

2 Claims, 3 Drawing Sheets

SEMICONDUCTOR CHIP HAVING GETTERING LAYER, AND METHOD FOR MANUFACTURING THE SAME

BACKGROUND OF THE INVENTION

1. Field of the Invention

The present invention relates to a semiconductor chip having a gettering layer for removing impurities such as heavy metals, and to a method for manufacturing the same.

2. Background Art

In the manufacture of semiconductor devices, heavy-metal contamination due to copper and nickel, and the like leads to the destruction of gate insulation films or the deterioration of element reliability, and is one of causes to lower the yield of devices. The heavy-metal contamination occurs not only in the process for forming an element layer including transistors or the like on the surface of a wafer (first-half process), but also in the process for dicing the wafer and assembling the semiconductor chips into a package (second-half process).

In order to prevent heavy-metal contamination, it is effective that a gettering layer for removing (gettering) heavy metals is previously formed in the part of a wafer or a semiconductor chip (for example, refer to Japanese Patent Laid-Open No. 2001-250957, or Japanese Patent Laid-Open No. 56-56660).

When a package having a structure wherein a plurality of semiconductor chips are laminated, such as a multi-chip package (MCP), is used, the thickness of each semiconductor chip must be thinned in the second-half process in order to raise the integration degree of the device.

By doing this, since the gettering layer formed inside or on the back face of the wafer in the first-half process is lost or thinned, there have been problems wherein the element layer is contaminated by heavy metals in the second-half process, and the yield of devices are lowered due to the defect of the gate insulation film.

SUMMARY OF THE INVENTION

The present invention has been devised to solve the above-described problems, and the object of the present invention is to provide a semiconductor chip having a gettering layer formed on the back face of the semiconductor chip for gettering heavy metals in the second-half process, and a method for manufacturing such a semiconductor chip.

The above object is achieved by a semiconductor chip wherein an element layer is formed on the front face, and the back face is joined to an underlying member, wherein a gettering layer is formed on said back face.

The above object is achieved by a method for manufacturing a semiconductor chip, wherein a gettering layer is formed on the back face of a semiconductor chip by mechanically grinding the back face of said semiconductor chip using a silica material to form a damaged layer.

Other objects and further features of the present invention will be apparent from the following detailed description.

BEST MODE FOR CARRYING OUT THE INVENTION

Figure 1:
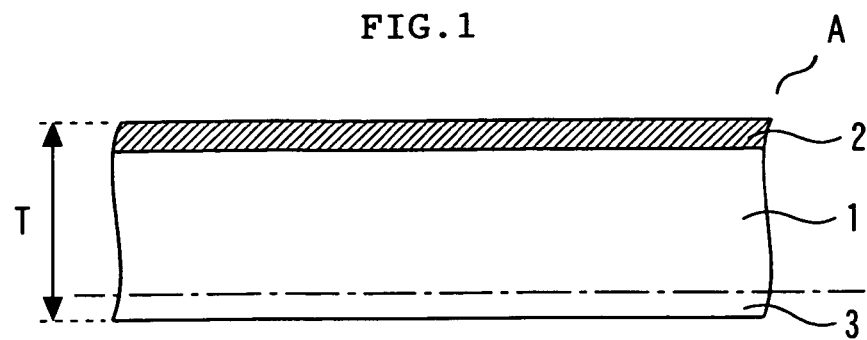
FIG. 1 is a sectional view of a semiconductor chip of the first embodiment.

The manufacture of a semiconductor device is completed through steps for forming an element layer having transistors and the like on the front face of a wafer and for performing electrical measurements (hereafter, these steps will be collectively referred to as the "first-half process"); and steps for cutting semiconductor chips out of the wafer by dicing, and for assembling them into a package (hereafter, these steps will be collectively referred to as the "second-half process"). Although there are various types of packages, a multi-chip package (hereafter referred to as "MCP") formed by laminating a plurality of semiconductor chips is widely used for raising the integration degree of the device.

The embodiments of the present invention will be described below referring to the drawings. In the drawings, the same or corresponding parts will be denoted by the same reference numerals, and the description thereof will be simplified or omitted.

First Embodiment

In the first embodiment, there will be described a semiconductor chip, wherein an element layer having transistors and the like is formed on the front face, and the back face is joined to an underlying member such as an MCP substrate, wherein a gettering layer is formed on the back face; and a method for the manufacture thereof.

First, although not shown in the drawing, in the first-half process, an element layer (2 to 3 μm) having transistors and the like is formed on the front face of a wafer of a thickness of 700 to 750 μm, and electrical measurements, such as G/W (good chip/wafer), are performed.

Next, the back face of the wafer (the surface opposite to the surface on which the element layer has been formed) is ground so that the thickness of the wafer becomes 100 μm or less, for example, about 90 μm. Thereby, the thickness of a semiconductor chip subsequently formed can be related to the MCP.

Then, the semiconductor chip is cut out of the wafer by dicing. At this time, the thickness of the semiconductor chip is about 90 μm.

FIG. 1 is a sectional view of a semiconductor chip A cut out of the wafer by dicing in the second-half process. The entire thickness T of the semiconductor chip A is about 90 μm. An element layer 2 having transistors and the like is formed on the front face of the semiconductor substrate 1, and a gettering layer 3 for trapping heavy metals is formed on the back face of the semiconductor chip A. The gettering layer 3 can be a thin film consisting of a polycrystalline silicon film or a silicon nitride film, as well as a damaged layer formed by mechanical polishing, grinding or ion implantation.

In the semiconductor chip A wherein the element layer 2 having transistors and the like was formed on the front face, a gettering layer 3 was formed on the back face of the semiconductor chip A which the back face is joined to an underlying member such as an MCP substrate. Thereby, heavy metals can be gettered in the second-half process.

Thereafter, a plurality of semiconductor chips A (not shown) are assembled into an MCP. At this time, since the thickness of a semiconductor chip A was 100 μm or less, the semiconductor chip A was related to the MCP, and the total thickness of the package could be thinned. Thereby, the integration degree of the device can be raised.

Next, as an example of forming the gettering layer 3 shown in FIG. 1, an example of forming a damaged layer on the back face of a semiconductor chip A will be shown.

Figure 2:
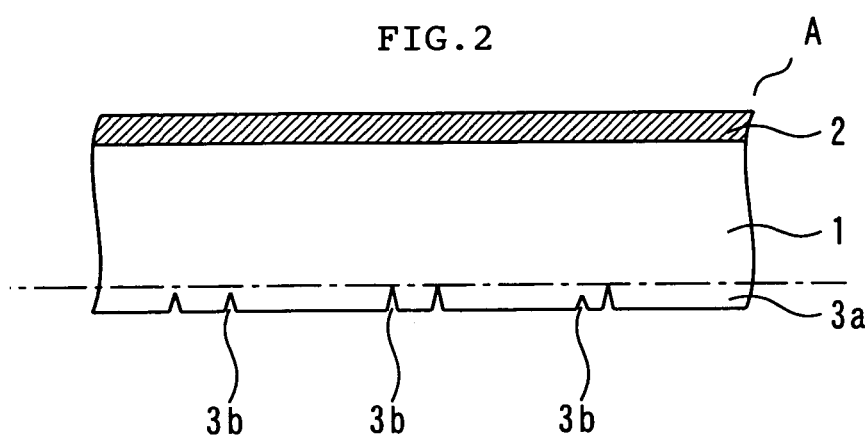
FIG. 2 is a sectional view of a semiconductor chip of the first embodiment.

The back face of a semiconductor chip A is mechanically polished using, for example, abrasive grains of a diameter of several microns consisting of a silica material containing silicon dioxide ($SiO_2$) as a major component, to form grooves 3b of a depth of 2 to 3 μm on the back face of a semiconductor chip A as FIG. 2 shows.

Thus, a damaged layer 3a (gettering layer) having grooves 3b can be formed on the back face of a semiconductor chip A. Thereby, a gettering layer having a uniform convexo-concave pattern can be formed.

Figure 3:
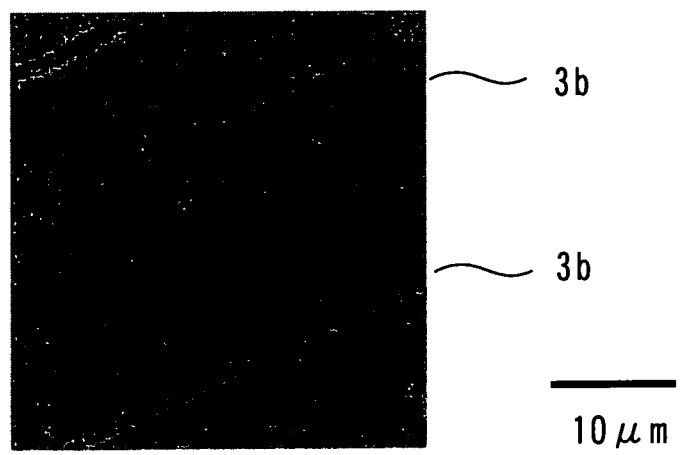
FIG. 3 is a micrograph of the back face of a semiconductor chip of the first embodiment.

FIG. 3 is a micrograph of the back face of a semiconductor chip A after polishing using the above-described method (refer to FIG. 2). Linear grooves 3b have been formed on the back face of a semiconductor chip A.

The damaged layer 3a shown in FIG. 2 can also be formed by grinding using grinding tools, such as a diamond wheel, sand blast, file, and needle. Alternatively, the damaged layer 3a can be formed using laser beams or focused ion beams (FIB). Thereby, the damaged layer 3a can be formed using a simple method.

Here, if the back face of a wafer or a semiconductor chip is ground to reduce thickness before assembling an MCP, there is a possibility that the gettering layer previously formed inside or on the back face of the wafer in the first-half process is lost or thinned. In addition, the thinner the thickness of a semiconductor chip, the more sensitive to the effect of heavy-metal contamination of the back face.

However, as shown in this embodiment, by forming a gettering layer 3 on the back face of a semiconductor chip A, heavy metals can be gettered in the second-half process even if the thickness of the semiconductor chip A is thinned to 100 μm or less.

Next, the percent defectives of devices after assembling the MCP (the lower the percent defectives, the higher the yield of devices) were compared when the gettering layer 3 was formed and not formed on the back face of the semiconductor chip A.

The results showed that when no gettering layer 3 was formed, the percent defective of the device was 61%, whereas when a gettering layer 3 was formed, the percent defective of the device was suppressed to about 0.7%.

This is considered because heavy-metal contamination was suppressed, and the percent defectives of devices caused by leakage current through the gate insulation film or the like were significantly lowered by the gettering layer 3.

As described above, in this embodiment, the gettering layer 3 formed on the back face of the semiconductor chip A was a damaged layer 3a. Thereby, heavy metals can be gettered in the second-half process. Therefore, the yield in the second-half process can be improved.

In this embodiment, the gettering layer 3 could be formed on the back face of the semiconductor chip A by forming the damaged layer 3a by mechanically grinding the back face of the semiconductor chip A using a silica material. Thereby, the gettering layer having a uniform convexo-concave pattern can be formed.

Alternatively, the gettering layer 3 could be formed on the back face of the semiconductor chip A using a simple method for forming the damaged layer 3a by grinding back face of the semiconductor chip A using a grinder.

Second Embodiment

In this embodiment, as an example of forming the gettering layer 3 described in the first embodiment, an example of forming a damaged layer by ion implantation will be described.

Figure 4:
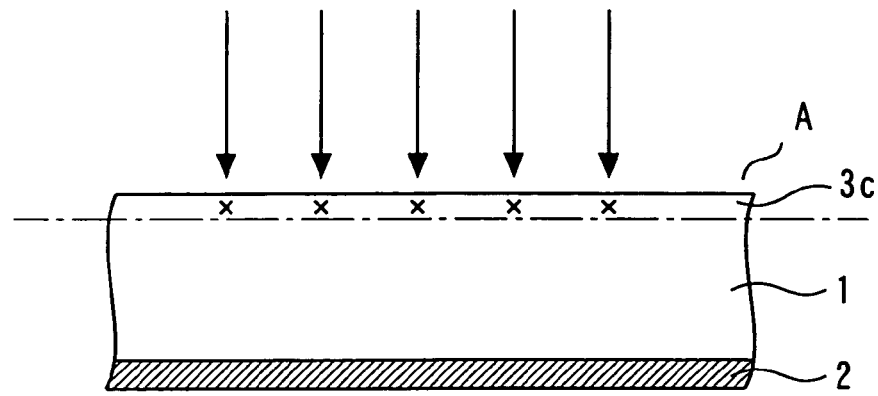
FIG. 4 is a sectional view of a semiconductor chip of the second embodiment.

FIG. 4 is a sectional view of a semiconductor chip A after a damaged layer 3c has been formed as the gettering layer 3 shown in FIG. 1 on the back face of the semiconductor chip A by ion implantation. (In FIG. 4, for the convenience of description, the back face of the semiconductor chip A was upside.)

The damaged layer 3c can be formed by ion implantation, for example, using ionic species, such as $Ar^+$, $P^+$, and $BF_2$, at an implanting energy of 50 to 100 keV or equivalent, and an implanting dose of $1\times10^{13}$ to $1\times10^{14}$ atoms/$cm^2$.

Alternatively, by controlling the implanting energy or implanting dose of ion implantation, the density of crystal lattice defect can also be controlled. Thereby, the gettering capacity can be improved as required.

In this embodiment, as described above, the gettering layer 3 formed on the back face of the semiconductor chip A was a damaged layer 3c formed on the back face of the semiconductor chip A by ion implantation. Thereby, in addition to the effect obtained in the first embodiment, the gettering capacity can be improved as required.

In this embodiment, a gettering layer 3 was formed on the back face of the semiconductor chip A by forming a damaged layer 3c by implanting ions into the back face of the semiconductor chip A. By thus forming, a gettering layer having an improved gettering capacity as required be controlling the implanting energy or implanting dose of ion implantation.

Third Embodiment

In this embodiment, as an example of forming the gettering layer 3 described in the first embodiment, an example of forming a thin film will be described.

Figure 5:
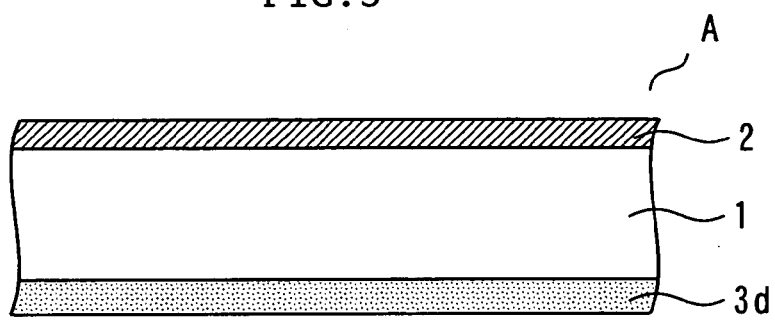
FIG. 5 is a sectional view of a semiconductor chip of the third embodiment.

FIG. 5 is a sectional view of a semiconductor chip A after forming a thin film 3d as a gettering layer 3 shown in FIG. 1 on the back face of the semiconductor chip A.

As the thin film 3d, a polycrystalline silicon film or a silicon nitride film is formed by low-temperature CVD at, for example, about 350° C. to 400° C. Thereby, the gettering layer can be formed by a simple method without affecting the characteristics of transistors and the like.

The thickness of the thin film 3d is about 1 μm, preferably within a range between, for example, 0.5 and 1.5 μm. This is because if the film thickness is thinner than 0.5 μm, there is possibility that heavy metals cannot be sufficiently gettered; and if the film thickness is thicker than 1.5 μm, there is possibility that defect is caused in the second-half process, such as poor bonding due to film stress.

By thus forming a thin film 3d on the back face of the semiconductor chip A, a gettering layer having a uniform thickness can be formed. Thereby, uniform and stable gettering can be performed against heavy metals.

In this embodiment, as described above, the gettering layer 3 formed on the back face of the semiconductor chip A was a thin film 3d consisting of a polycrystalline silicon film or a silicon nitride film. Thereby, in addition to the effect obtained by the first embodiment, uniform and stable gettering can be performed.

In this embodiment, a gettering layer 3 was formed on the back face of the semiconductor chip A by forming a thin film 3d consisting of a polycrystalline silicon film or a silicon nitride film on the back face of the semiconductor chip A. Thereby, a gettering layer 3 having a uniform thickness can be formed.

Fourth Embodiment

In this embodiment, a semiconductor chip wherein an element layer having transistors and the like on the front face, and the back face is joined to the underlying member such as an MCP substrate, wherein crystal lattice defect is previously formed inside of the wafer before forming an element layer in the first-half process; and a method for manufacturing such a semiconductor chip.

Figure 6:
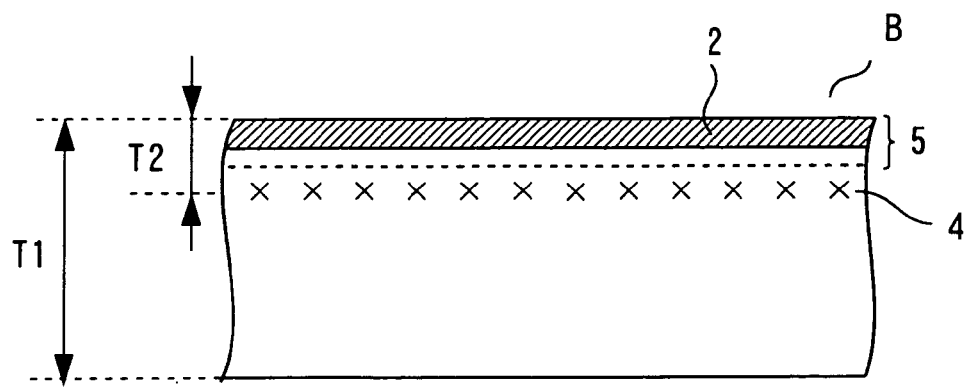
FIG. 6 is a sectional view of a wafer of the fourth embodiment.

FIG. 6 is a sectional view of a wafer B, after a crystal lattice defect layer 4 has been formed inside the wafer B in the first-half process, then, forming an epitaxial layer 5 on the front face of the wafer B, and then, forming an element layer 2 having transistors and the like on the front face thereof. The wafer B is a p-type silicon wafer having a resistivity of 10 to 15 mΩ.cm due to the addition of boron, and a total thickness $T_1$ of 700 to 750 μm.

Next, a method for forming a crystal lattice defect layer 4 and an epitaxial layer 5 shown in FIG. 6 will be described.

First, by a first heat treatment, a crystal lattice defect layer 4 is formed at the location of a depth T2 (about 50 to 80 μm) from the front face of a wafer B. The first heat treatment is performed in a nitrogen gas or argon gas atmosphere having a 2-step treatment wherein after heat treatment at 500 to 600° C. for 1 to 2 hours, heat treatment is performed at 900 to 1000° C. for 2 to 3 hours. At this time, the temperature and treating time in each step are controlled so that the density of crystal defect formed inside the wafer B becomes $1\times10^4/cm^2$ or more.

Next, by a second heat treatment, an epitaxial layer 5 of a thickness of about 5 to 10 μm is formed on the front face of the wafer B. The second heat treatment is performed in a mixed-gas atmosphere of $SiH_4$ (monosilane) and hydrogen at 1100 to 1150° C. for about 10 minutes. Thereby, the epitaxial layer 5 having a resistivity of 2 to 20 mΩ.cm is formed on the front face of the wafer B. Furthermore, an element layer 2 of a thickness of about 2 to 3 μm having transistors and the like is formed on the surface of the epitaxial layer 5.

Thereafter, a semiconductor chip of a thickness of about 90 μm (not shown) is formed by dicing the wafer B. At this time, since the crystal lattice defect layer 4 has been formed at the location about 50 to 80 μm from the front face of the wafer B, the density of the crystal lattice defects contained in the entire semiconductor chip is $1\times10^4/cm^2$ or more even after dicing.

Thus, a crystal lattice defect layer having a density of the crystal lattice defects of $1\times10^4/cm^2$ or more was previously formed inside the wafer B before forming the element layer so that the density of the crystal lattice defects contained in the entire semiconductor chip finally formed became $1\times10^4/cm^2$ or more.

Figure 7A:
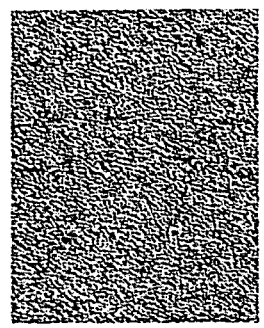
FIGS. 7A and 7B are micrographs of a wafer of the fourth embodiment.
Figure 7B:

FIG. 7A is a micrograph of the wafer after above-described first and second heat treatments; and FIG. 7B is a micrograph of the wafer without either heat treatment (prior art).

By the comparison of both wafers, it is seen that a crystal lattice defect layer having a convexo-concave pattern formed by heat treatments is formed inside the wafer B. The density of the crystal lattice defects of the wafer shown in FIG. 7A is $5.1\times10^6/cm^2$.

Here, by performing heat treatment in an argon or hydrogen atmosphere at 1200 to 1300° C. instead of the step for forming the epitaxial layer 5 by the above-described second heat treatment, a non-defect layer (not shown) of a thickness of 5 to 20 μm can be formed on the front surface of wafer B.

Figure 8A:
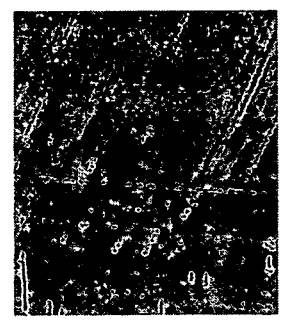
FIGS. 8A and 8B are micrographs of a wafer of the fourth embodiment.
Figure 8B:
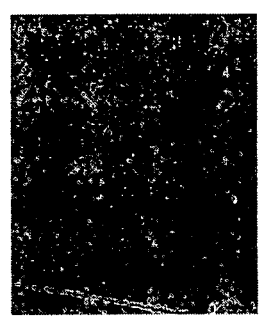

FIG. 8A is a micrograph of the wafer after the above-described first heat treatment and the heat treatment for forming the non-defect layer; and FIG. 8B is a micrograph of the wafer without either heat treatment (prior art).

By the comparison of both wafers, it is seen that a crystal lattice defect layer having a convexo-concave pattern formed by heat treatments is formed inside the wafer B. The density of the crystal lattice defects of the wafer shown in FIG. 8A is $4.5\times10^5/cm^2$.

Thus, in the first-half process, a crystal lattice defect layer is formed at the location about 50 to 80 μm from the front face inside the wafer so that the density of crystal lattice defects contained in the entire wafer becomes $1\times10^4/cm^2$ or more. Thereby, even after the wafer has been diced to form a semiconductor chip having a thickness of 100 μm or less, a semiconductor chip having a density of crystal lattice defects contained in the entire semiconductor chip of $1\times10^4/cm^2$ or more can be obtained.

The percentage defect of the device after assembling an MCP using this semiconductor chip was substantially equivalent to the percentage defect of the device (0.5%) when a gettering layer was formed on the back face of the semiconductor chip.

This is considered because the crystal lattice defects contained in the semiconductor chip has a gettering effect in the second-half process.

In this embodiment, before forming an element layer in the first-half process, crystal lattice defects were previously formed inside the wafer so that the density of crystal lattice defects contained in the semiconductor chip finally formed became $1\times10^4/cm^2$ or more. In addition to this, a gettering layer may be formed on the back face of the semiconductor chip using the method shown in any of embodiments 1 to 3. Thereby, since the gettering effect in the second-half process is improved, the yield of devices in the second-half process can be further improved.

In this embodiment, as described above, after forming a crystal lattice defect layer 4 by the heat treatment of a wafer B so that the density of crystal lattice defects contained in the wafer became $1\times10^4/cm^2$ or more, an element layer 2 was formed and the wafer B was diced to form a semiconductor chip having a density of crystal lattice defects of $1\times10^4/cm^2$ or more.

The semiconductor chip was thus formed so that a crystal lattice defect layer is contained inside the semiconductor chip, and the density of crystal lattice defects contained in the entire semiconductor chip became $1\times10^4/cm^2$ or more.

By this forming, the yield in the second-half process can also be improved.

Fifth Embodiment

In this embodiment, there will be described a method for improving the yield of devices when a plurality of semiconductor chips are laminated in the step for assembling an MCP. In the MCP, although three or more semiconductor chips can be laminated on a substrate of the package, here, to simplify the description, an example wherein two semiconductor chips are laminated will be chiefly described.

Figure 9:
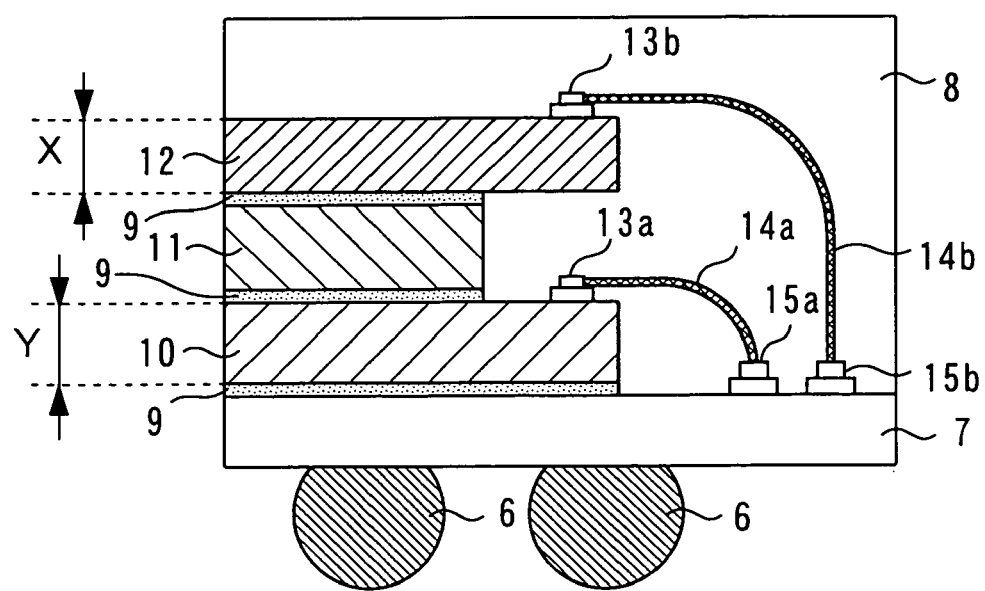
FIG. 9 is a sectional view of an MCP of the fifth embodiment.

FIG. 9 is a sectional view of an MCP formed by laminating two semiconductor chips having two different thicknesses. An MCP substrate 7 is fixed on solder balls 6, and a resin 8 is encapsulated inside the entire MCP. A lower semiconductor chip 10 is fixed on the MCP substrate 7 through an adhesive layer 9. Further thereon, an upper semiconductor chip 12 is laminated through adhesive layers 9 and a spacer 11. Wiring terminals 13a and 13b are installed on the lower semiconductor chip 10 and the upper semiconductor chip 12, respectively, which are connected to wiring terminals 15a and 15b on the MCP substrate 7 by gold wires 14a and 14b, respectively.

At this time, the lower semiconductor chip on the MCP substrate 7 is laminated so that the thickness thereof is relatively larger than the thickness of the upper semiconductor chip laminated immediately above it. In other words, in the MCP shown in FIG. 9, when the thickness of the upper semiconductor chip 12 is X μm, and the thickness of the lower semiconductor chip 10 is Y μm, the relation is X<Y.

When three or more semiconductor chips are laminated in an MCP, the thickness of the semiconductor chip fixed on the substrate of the MCP is made relatively larger than the thickness of the semiconductor chip fixed immediately above it.

By the above-described method, the percentage defects of devices were compared in the step for assembling two semiconductor chips having different thicknesses into an MCP.

In FIG. 9, when the thickness of the upper semiconductor chip 12, X=150 μm, and the thickness of the lower semiconductor chip 10, Y=90 μm (X>Y), the percentage defect of the device was 62.5%. Whereas, when X=90 μm and Y=150 μm (X<Y), the percentage defect of the device was 1.2%, and the percentage defect of the device could be significantly lowered.

This is considered because when the thickness of the lower semiconductor chip is relatively larger than thickness of the upper semiconductor chip, the stress imparted by the upper semiconductor chip to the lower semiconductor chip can be relaxed. Thereby, the yield of devices in the step for assembling the MCP can be improved.

In addition, as FIG. 9 shows, a silicon substrate or a polycrystalline silicon film was laminated as a spacer 11 (cushioning material) between the lower semiconductor chip 10 on the MCP substrate 7 and the upper semiconductor chip 12 laminated immediately above it. For example, a thin film formed by recovering and polishing a P-type silicon substrate containing a P-type impurity, such as boron, or a dummy wafer containing an N-type silicon substrate consisting of an N-type impurity, such as phosphorus, so that the resistivity becomes 1 to 100 Ω.cm, is used. Alternatively, a polycrystalline silicon film having a resistivity of 1 to 100 Ω.cm is used. Thereby, since the spacer 11 can getter heavy metals in the step for assembling the MCP, the yield of devices in this step can be further improved.

In order to raise the integration degree of devices including the entire package, it is preferred to reduce the thickness of the entire MCP. Therefore, the above-described spacer 11 is preferably formed to be thin. However, if the spacer 11 is excessively thin, the gettering effect is reduced; therefore, the spacer 11 is formed so as to have a film thickness of 50 to 100 μm.

Since the spacer 11 acts as a cushioning material between the lower semiconductor chip 10 and the upper semiconductor chip 12, the stress imparted by the upper semiconductor chip 12 to the lower semiconductor chip 10 can be relaxed. Thereby, the yield of devices in the step for assembling the MCP can be further improved.

As a semiconductor chip mounted in the MCP, a semiconductor chip having a gettering layer formed on the back face shown in the first to fourth embodiments, or a semiconductor chip having a density of crystal lattice defect contained inside the semiconductor chip of $1 \times 10^4/cm^2$ or more can also be used. By using such a semiconductor chip, since the gettering effect in the second-half process is improved, the yield of devices in the step for assembling the MCP can be further improved.

In this embodiment, as described above, in a semiconductor package formed by laminating a plurality of semiconductor chips on an MCP substrate 7, the thickness of the lower semiconductor chip on the MCP substrate 7 was relatively larger than the thickness of the upper semiconductor chip laminated immediately above it. Thereby, the stress imparted by the upper semiconductor chip to the lower semiconductor chip can be relaxed, and the yield of devices in the step for assembling the MCP can be improved.

The invention claimed is:

1. A semiconductor device comprising:
   a semiconductor chip which includes an element layer formed on a front face of the semiconductor chip and a gettering layer on a back face of the semiconductor chip;
   a package substrate which faces the back face; and
   a resin covering the semiconductor chip and the package substrate,
   wherein a thickness of said semiconductor chip is 100 μm or less,
   wherein said gettering layer is a damaged layer,
   wherein the damaged layer includes a plurality of grooves,
   wherein a depth of each of said grooves is 2 to 3 μm, and
   wherein in plan view to said semiconductor chip, each of said grooves is a linear groove.

2. A semiconductor device comprising:
   a semiconductor chip which includes an element layer formed on a front face of the semiconductor chip and a gettering layer on a back face of the semiconductor chip;
   a substrate which faces the back face;
   a wire; and
   a resin covering the semiconductor chip, the wire and the package substrate,
   wherein a thickness of said semiconductor chip is 100 μm or less,
   wherein said gettering layer is a damaged layer,
   wherein the damaged layer includes a plurality of grooves,
   wherein a depth of each of said grooves is 2 to 3 μm, and
   wherein in plan view to said semiconductor chip, each of said grooves is a linear groove, and
   wherein the wire electrically connects between the substrate and the semiconductor chip.

* * * * *